United States Patent [19]

Bigbie

[11] 3,914,610

[45] Oct. 21, 1975

[54] IR-DETECTOR GAIN CONTROL WITH AMBIENT TEMPERATURE COMPENSATING MEANS

[75] Inventor: Claude R. Bigbie, Thousand Oaks, Calif.

[73] Assignee: The United States of America as represented by the Secretary of the Army, Washington, D.C.

[22] Filed: Nov. 21, 1972

[21] Appl. No.: 308,631

[52] U.S. Cl. ............ 250/338; 250/352; 200/61.02; 337/86; 307/117; 340/417

[51] Int. Cl.$^2$ ............ G01J 1/00

[58] Field of Search ........... 250/330, 332, 333, 350, 250/338, 352; 200/61.02; 337/86; 307/117; 340/417

[56] References Cited

UNITED STATES PATENTS

| | | | |
|---|---|---|---|
| 3,245,509 | 4/1966 | Larson | 307/117 UX |
| 3,365,576 | 1/1968 | Teeg | 250/332 X |
| 3,487,212 | 12/1969 | Micheron et al. | 250/330 |
| 3,635,085 | 1/1972 | Shimotsuma et al. | 250/330 X |
| 3,676,677 | 7/1972 | Condas et al. | 250/330 |

*Primary Examiner*—Verlin R. Pendegrass
*Assistant Examiner*—Peter A. Nelson
*Attorney, Agent, or Firm*—Lawrence A. Neureither; Jack W. Voigt; Robert C. Sims

[57] ABSTRACT

An infrared detector system which utilizes a preamplifier is operated over an infrared radiation input range which is normally beyond the capability of the preamplifier. This is accomplished by the use of a switching device to change the temperature operation of the infrared detector upon sensing the output of the amplifier is reaching a saturation condition.

1 Claim, 2 Drawing Figures

IR-DETECTOR GAIN CONTROL WITH AMBIENT TEMPERATURE COMPENSATING MEANS

SUMMARY OF THE INVENTION

In a homing tracker an infrared detector is provided to change incident infrared radiation into electrical signal. This signal is then amplified by a preamplifier whose output is in turn further amplified. The output signal is used to control guidance of the tracker. Typical preamplifiers will normally saturate for an increase in signal level range of approximately $10^4$ to $10^5$. However, the requirements for this particular tracker are that it detect input radiation spreading over ranges of $10^7$ or greater.

The detector which may be doped germanium or doped silicon having an output which is depended upon as temperature. Normally the temperature of such a detector is maintained constant by a temperature control loop. However, in this system, when the preamplifier approaches its saturation level output, the amplitude detector senses this and sends this indication through a gain control logic circuit to a switching circuit. The switching circuit will change the reference voltage for the temperature control loop and change the temperature at which the detector is maintained. Since the homing tracker for which this invention was conceived will see a continuing increase of the infrared radiation until intercept, the switching device will be locked once the gain control logic switches it on.

The temperature of the detector will be increased to a higher level after the detector has caused the switch to lock-in to the new position. At this new higher temperature the detector will have smaller outputs in relation to the radiation input; therefore the preamplifier will drop down to an unsaturated level. In this way the range of the output of the preamplifier with respect to the infrared input has been extended. The output of the preamplifier, after switching occurs, will drop down to a level of voltage which it had been previously; however, this repeat of output signals is permissible in the system, as the system is detecting change in the preamplifier output and not merely its amplitude.

DESCRIPTION OF THE PREFERRED EMBODIMENT

Figure 1:
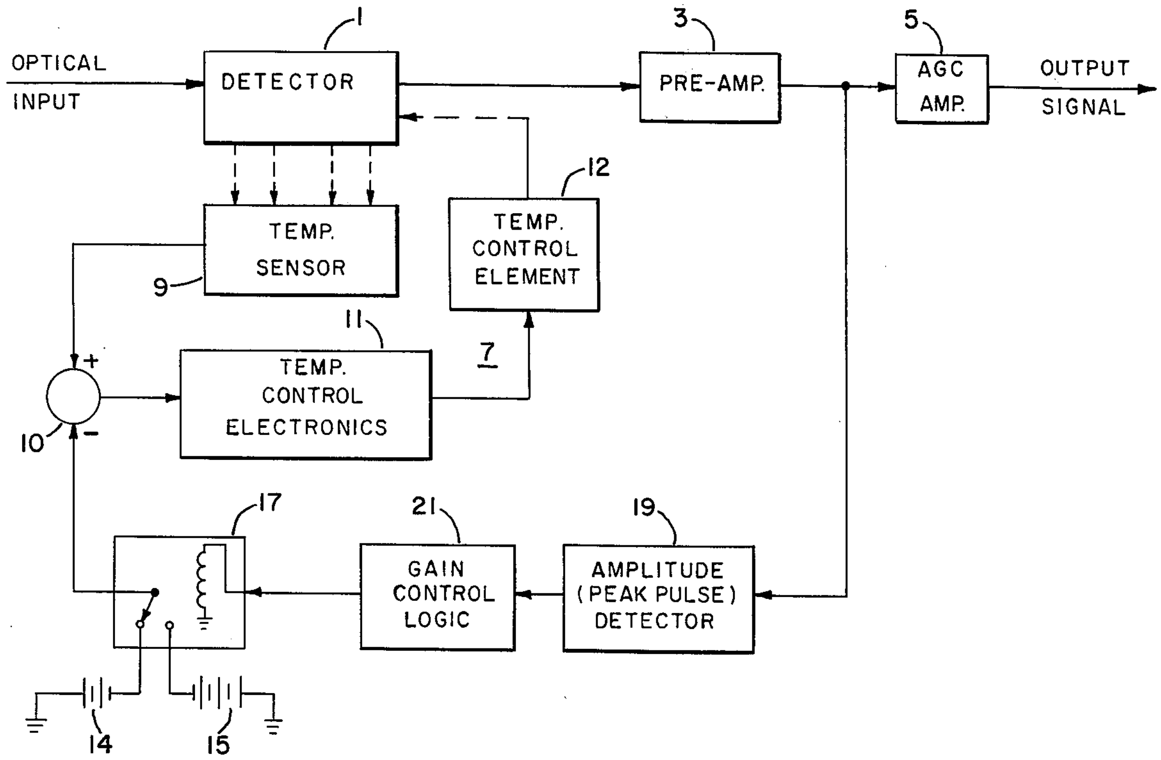
FIG. 1 is a block diagram showing the preferred embodiment of the invention.

The infrared detector system shown in FIG. 1 employs a detector 1 which serves as a transducer to change incident infrared radiation (optical input) into an electrical signal. Detector 1 operates in the photoconductive mode, i.e., detector conductance changes with input radiation. The signal output from the detector 1 is amplfied by a preamplifier 3 and then by an automatic gain control amplifier 5. Typical input radiation received by the system has increased in the recent past from dynamic ranges of $10^4$ to the present dynamic ranges of $10^7$ or greater. In the configurations shown in FIG. 1 without any compensation taking place, preamplifier 3 will reach its saturation level long before the input radiation reaches its maximum.

The detector 1 may take the shape of a doped germanium or doped silicon whose output is inversely proportional to its ambient temperature. The ambient temperature of detector 1 is controlled by a temperature control loop 7. This loop consists of a temperature sensor 9, a combining means or mixer 10, temperature control electronics 11 and a temperature control element 12. This temperature control loop is well known in the art and the circuit elements 9–12 may take the form of any of the well known temperature control loop circuits.

Figure 2:
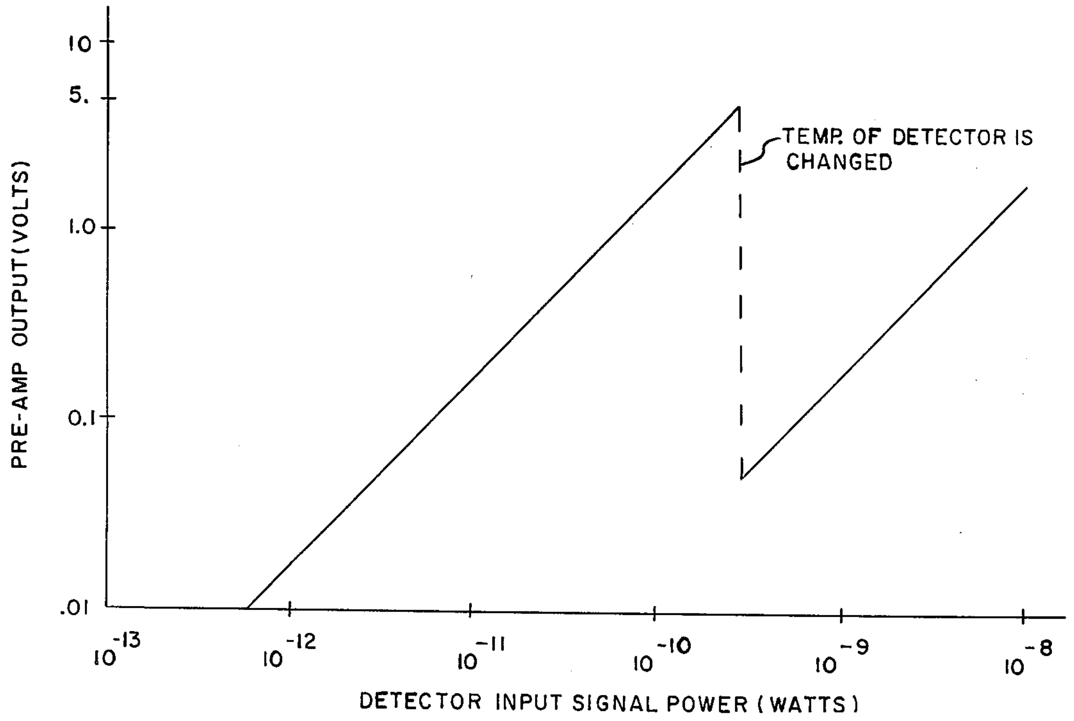
FIG. 2 is a graph of the output of the preamplifier in comparison to the detector input signal power.

A temperature reference voltage is supplied by voltage supply 14 or 15 (depending upon the condition of switch 17) to the voltage comparing means 10. In the position shown in FIG. 1, detector 1 is maintained at a predetermined low temperature state as compared to the temperature state it will be in when the switch 17 is in the opposite position. At this low temperature state the output of detector 1 with respect to optical input will be greater than when the detector is in the higher temperature state. FIG. 2 illustrates this point by comparing the input power to the detector 1 and the output power of preamplifier 3.

As is shown in FIG. 2 the saturation level of preamplifier 3 will be reached (without switching of the temperature of the detector) long before the dynamic range of the optical input is spanned. In order to extend the range preamplifier 3 can cover, its output is sensed by an amplitude detector 19. The amplitude detector 19 can be any of the well known detectors which detect the peak pulse output of preamplifier 3 and provide an output when preamplifier 3 exceeds a predetermined value. This predetermined value in this case would be 5 volts or any value short of the non-linear range or saturation level of preamplifier 3. Upon sensing this output, amplitude detector 19 provides a signal to gain control logic 21 which is designed to insure that the control circuit does not switch on a noise pulse. The gain control logic circuit 21 insures that a minimum number of signal pulses are received from detector 19 in a given time interval before switch 17 is energized. Any of the known gain control logic circuits with this characteristic may be used. Gain control logic circuit 21 could be eliminated and amplitude detector 19 connected directly to switch 17 if noise is not a problem.

When gain control logic circuit 21 produces an output, switch 17 will move to the opposite position shown in FIG. 1. Switch 17 is of the latching type and will lock into the opposite position shown in FIG. 1 once energized by gain control logic 21. Any of the well known latching type switching means may be used such as that found in "Modern Dictionary of Electronics" by Howard W. Sams, Oct. 1963, page 193. In the homing tracker in which this invention is utilized, the signal amplitude of the optical input continuously increases until intercept; therefore, once the required amplitude is reached, the temperature reference may be switched and locked at the new value. This prevents drop-out and hunting when the output of detector 1 decreases, and the preamplifier output drops accordingly.

Once switch 17 is locked into the opposite position shown in FIG. 1, the reference voltage supplied to combining means 10 is not of such a value as to cause the temperature control loop 7 to maintain ambient temperature detector 1 at a higher level. This will cause the drop in detector output with respect to the optical input as indicated in FIG. 2. The drop in the output of detector 1 will, of course, cause the output of preamplifier 3 to take on the lower line shown in FIG. 2 and, therefore, stay out of saturation for higher values of optical input to detector 1. This extends the range of preamplifier 3 with respect to optical input. Since amplifier 3 sends its signal to automatic gain control amplifier 5, the fact that the output signal jumps to a lower voltage and is now retracing previous amplitudes will not effect the system.

I claim:

1. A control circuit comprising a temperature sensitive detector having an input and an output; an amplifier having an input and an output; the output of said detector being connected to the input of said amplifier; temperature controlling means connected to said detector for controlling the ambient temperature thereof; sensing means having an input connected to the output of said amplifier and an output connected to control said temperature controlling means; said temperature controlling means maintaining the ambient temperature of the detector at a first predetermined ambient temperature until receipt of a signal from the output of the sensing means, at which time the temperature controlling means will cause the ambient temperature of the detector to change; said sensing means producing an output only when the output of the amplifier reaches a predetermined value; said detector is an optical detector having optical radiation fed to its input; said temperature controlling means having therein a switching means which, when in one condition, will cause the temperature controlling means to control the detector at said first predetermined ambient temperature and, when in the second position, will cause the temperature controlling means to control the temperature to a different ambient temperature; said switching means having a control input; said sensing means comprising an amplitude detector having an input connected to the output of the amplifier and an output connected to said control input of the switching means; said optical input is infrared radiation; said sensing means further comprising a gain control logic circuit connected between the output of the amplitude detector and the input of said control means of said switching means; and said gain control logic circuit preventing the output of amplitude from reaching said switching means until the detector has an amplitude output for a predetermined minimum amount of time.

* * * * *